United States Patent [19]

Tihanyi et al.

[11] Patent Number: 4,623,086

[45] Date of Patent: Nov. 18, 1986

[54] PROCESS OF MONITORING FOR THE REFLECTIVITY CHANGE IN INDIUM PHASE TRANSITION SOLDERING

[75] Inventors: Peter L. Tihanyi, Yorktown, N.Y.; Jeffrey S. Mott, Westwood, N.J.; Hubert J. Vollmer, Mahopac, N.Y.; Maryanne Sovak, Shenorock, N.Y.; Sonnia C. Rojas, Ossining, N.Y.

[73] Assignee: McDonnell Douglas Corporation, Long Beach, Calif.

[21] Appl. No.: 710,505

[22] Filed: Mar. 11, 1985

[51] Int. Cl.$^4$ ............................................. H01L 21/58
[52] U.S. Cl. ..................................... 228/123; 228/220
[58] Field of Search ............... 228/123, 205, 208, 219, 228/220, 122, 124; 357/15, 17

[56] References Cited

U.S. PATENT DOCUMENTS

| | | | |
|---|---|---|---|
| 3,651,562 | 3/1972 | Hambleton | 228/123 |
| 3,857,161 | 12/1974 | Hutchins | 228/220 |
| 3,896,473 | 7/1975 | DiLorenzo et al. | 357/15 |
| 3,922,775 | 12/1975 | Potter | 228/123 |
| 4,039,116 | 8/1977 | Chaffin | 228/123 |
| 4,179,534 | 12/1979 | Chang et al. | 357/17 |
| 4,389,557 | 6/1983 | Devenyi et al. | 228/123 |
| 4,540,115 | 9/1985 | Hawrylo | 228/123 |

*Primary Examiner*—M. Jordan
*Attorney, Agent, or Firm*—Gregory A. Cone; George W. Finch; Donald L. Royer

[57] ABSTRACT

An element is soldered to a heat sink by a flux-free technique in which flux-free solder is first deposited onto the heat sink surface, then the element is placed into position on the surface, then the heat sink is placed into and held at a constant temperature in a pressure controlled chamber to a level below the melting point of the solder while undergoing a plurality of cycles of introduction and purging of an oxygen stripping gas. Then the heat sink is raised to a temperature sufficient to cause a solid to liquid phase change to the solder layer in the presence of the oxygen stripping gas which is marked by optically detecting the change by monitoring the reflectivity change characteristic of the phase transition then holding the solder in a liquid state for a second interval of time sufficient to allow the majority of the solder oxidation at the interface between the solder and the element to be removed by the action of the oxygen stripping gas, and then rapidly cooling the heat sink and the element to room temperature.

10 Claims, No Drawings

PROCESS OF MONITORING FOR THE REFLECTIVITY CHANGE IN INDIUM PHASE TRANSITION SOLDERING

BACKGROUND OF THE INVENTION

This invention relates to soldering techniques. More particularly, this invention relates to flux-free soldering techniques useful in micro electronic fabrication methods.

Conventional methods for adhering various elements onto heat sinks or other base assemblies in electronic fabrication processing have utilized flux solder methods and epoxy type cements. These conventional methods are satisfactory for a wide variety of usages. However, there are a number of micro electronic applications in which the organic content of the solder flux and of typical epoxy cements will create problems for the micro electronic device. One such usage involves gallium arsenide laser diodes as utilized in low pressure environments such as space satellites. These gallium arsenide laser diodes are utilized for communication systems, often in a continuous mode. In this type of application, the gallium arsenide laser diode produces a large amount of heat relative to its size which must be extracted from the laser diode chip or chip breakdown will occur. To this end, the gallium arsenide laser diodes are always heat sinked to extract this heat. Unfortunately, the combination of the heat with the low pressure environment will cause any organic matter to outgas from the solder joint or the epoxy cement. This out-gassing will then redeposit upon the facets of the gallium arsenide laser diode chip, altering the reflectivity of these surfaces and degrading the performance of the device. Therefore, it has remained necessary to develop methods for adhering these laser diode chips onto the heat sinks without using an organic based compound.

One flux soldering technique has been to deposit either an indium (In) or a gold-tin (Au/Sn) alloy solder onto the heat sink using a thermal evaporation system. A laser diode chip is then positioned on top of the deposited solder layer. The chip and the surface of the heat sink are then heated by a gas jet to a temperature of about 240° Centigrade for indium solder in the open atmosphere. The gas jet acts to liquify the indium solder surrounding the periphery of the laser diode chip but does not liquify the indium solder layer directly beneath the laser diode chip. This technique is sufficient to produce an adequate solder bond; however, there is a residual contamination by oxidation of the indium at the interface between the top of the indium solder layer and the bottom of the laser diode chip. The presence of this oxidation at this interface degrades the performance of the heat sink and thereby the performance of the laser diode chip itself.

SUMMARY OF THE INVENTION

This process is useful for flux-free soldering of a first element onto a larger base element. In particular, flux-free soldering of a gallium arsenide laser diode chip onto a heat sink is contemplated. First, a flux-free solder is deposited onto a surface of the heat sink. Then the particular element is placed in proper position on the soldered covered surface. The element and the heat sink are then placed into a pressure controlled low vacuum chamber in which the temperature of the heat sink is held at a level below the melting point of the solder for a first interval of time. During this first time interval, an oxygen stripping gas is alternately introduced into and purged from the chamber in a plurality of cycles. The temperature of the heat sink is then raised to an elevated level sufficient to cause a solid to liquid phase change to the solder layer, again in the presence of the oxygen stripping gas. This phase change is easily detected by a momentary change in reflectivity on the surface of the solder layer which marks this phase transition. The solder is then held in a liquid state for a second interval of time (30 to 90 seconds) sufficient to allow the majority of the oxidation of the solder layer at the interface between the solder and the element to be removed by the action of the oxygen stripping gas. Finally, the ensemble is rapidly cooled, causing the solder to resolidify. The cooling is rapid enough that there will be no reoxidation at the interface between the element and the solder layer. The prior art processing also contemplates the usage of multiple cycles and purges of a gas which acts to strip out the oxygen impurities from the solder pad in the areas surrounding the laser diode chip. However, since the solder remains solid underneath the chip, the impurities at the interface remain.

DETAILED DESCRIPTION OF THE INVENTION

As was discussed above, this technique will find ready application for the solder of gallium arsenide laser diodes onto heat sinks. However, the process of this invention may be expanded to several other applications, such as semiconductor detectors, and, in a broader sense, any electronic element which needs to be bonded to a base element by a flux-free soldering process for use in a low pressure environment. The true scope of the invention should be defined by the appended claims and not limited solely to the specific embodiment discussed below.

Prior to a specific discussion of the flux-free soldering technique, a more general discussion of the laser diode heat sink assembly is in order. The heat sink itself may be fabricated from beryllium oxide or diamond or copper. The beryllium oxide is normally metallized with a titanium-platinum-gold coating, and the copper heat sink would normally be metallized with a nickel-platinum-gold layer. The laser diode chip is soldered with its active side down to an indium solder pad layer. A gold-tin solder could be substituted for the indium solder. This provides for one of the two required electrical contacts for the laser diode chip. The other electrical contact is taken out from the other side of the chip by a very fine gold wire to a rail structure which is also affixed to the top side of the heat sink. This rail is an insulator block, usually of aluminum oxide, which has a copper-nickel-gold or chrome-gold, or other top pad metallization. The thin gold wire conductor from the top side of the laser diode chip is run from the laser diode chip surface over to the top side of the rail. A separate conductor is then run out from the top side of the rail to whatever the current driver source is for the laser diode chip. The rail itself is soldered down on its bottom side to the heat sink by a gold-tin solder layer. The P side of the laser diode chip is the side that is normally attached to the indium solder layer of the heat sink and the N side is the upper side which is electrically connected to the rail. The rail is biased positive, and the heat sink is biased negative.

Turning now to the flux free solder process itself, the first step is to deposit the indium solder layer onto the upper surface of the heat sink. Other materials besides indium may be used for the solder layer. A primary qualification will be that the melting point of the solder material be at a reasonable temperature. Lead/tin and other alloys or elements will meet this qualification. The individual laser diode die or chip is then emplaced onto the indium solder pad in its proper position and then the ensemble is placed on a heating stage inside a pressure controlled chamber. The heating stage is then held at a constant temperature well below the melting-point of the solder (indium in this case). This temperature is equipment dependent but should not elevate the indium layer to above its melting point (157° C.). It should be noted that although a vacuum is drawn on the chamber, this chamber pressure is not extremely low, since an extreme vacuum will cause some degree of vaporization of the indium layer with detrimental redeposition onto the mirror surfaces of the gallium arsenide laser diode chips when the indium is in its liquid state. Normally the vacuum level will be about $10^{-2}$ Torr. In the prior art gas jet heating process, the temperature of the heat sink normally remains at about 95° C.

With the entire heat sink block ensemble being held at a temperature somewhat below that necessary to melt the indium solder layer, the ensemble is then subjected to several cycles of an oxygen stripping gas which are introduced into the low vacuum environment within the chamber. The vacuum is pulled relatively continuously during this phase of the operation. The oxygen stripping gas can be any one of a number of gases, normally it will be hydrogen or forming gas which is a mixture of hydrogen and nitrogen gases. These preliminary cycles of the gas act to remove the oxygen and other impurity contamination from the surface of the indium solder pad except for the area immediately beneath the laser diode chip. It should be noted that some degree of oxygen contamination is desirable during both the present process and the prior art processing techniques. This is because the indium as deposited is in its pure state which is non-sticky. If no flux is used, a thin skin of oxygen contamination develops over the unprotected indium around and under the laser diode chip, acting as a support to hold the chip in place during soldering. Normally a maximum of about twenty minutes is allowed from the initial indium evaporation to the initation of the reflow sequence in which the indium solder layer is elevated above its phase change temperature from solid to liquid. Within this twenty minutes, a maximum depth of about 15 to 25 Angstroms of indium oxide grows on the surface of the solder pad. This oxygen comes from the interval when the indium layer is exposed to the atmosphere between the indium deposition step and the emplacement of the ensemble into the pressure-controlled chamber. This oxygen contamination will be consumed by the hydrogen gas during the preliminary gas cycles in the regions surrounding the chips. The preliminary introduction-purge cycles are relatively short cycles in which the hydrogen gas is present in the chamber for usually no more than about one minute which alternate with gas-free evacuated phases. A final dose of the gas is introduced into the chamber which will remain through the following reflow operation.

The second phase of the operation is called the reflow operation and involves the preceding final introduction of oxygen stripping gas into the chamber with an attendant raise in temperature of the heater to produce a phase change from solid to liquid in the indium solder pad. The length of time for this specific embodiment from the introduction of the final oxygen stripping gas cycle to the phase change from solid to liquid of the indium solder layer should not be more than about ten minutes. The length of time in which the indium solder layer is held in its liquid state is fairly critical. The onset of the phase change is readily detected by optical observation of the reflectivity of the solder pad surface. The phase change is marked by a momentary but distinct change in reflectivity as the phase change occurs. This phase change is conveniently observed by a microscope or a magnifying video camera. In any event, the oxygen stripping hydrogen gas within the chamber now has a chance to act upon the liquified solder layer beneath the laser diode chips since the contamination at the interface between the chip and the indium solder layer will now move around to some extent since the indium solder is now in a liquid state. Also, there is a very thin (approximately one micron) zone which is permeable to the oxygen-stripping gas between the rough surface of the bottom of the chip and the indium oxide layer. The actual length of time in which the indium solder layer will remain in its liquid state should be a matter of experimentation for the individual application. For the specific embodiment herein, the preferred time is about one minute. The expected range of time would be from a few seconds to probably about no more than ten minutes for other implementations utilizing indium solder. After the termination of this critical time period, the ensemble is rapidly cooled down by introducing water into the cooling lines present in the heater or heating stage, as it is also called. This rapid cooling solidifies the solder layer almost instantaneously with the temperaure dropping to about 30° C. No further contamination of the interface between the laser diode chip and the indium solder pad is possible due to the rapidity of the solidification of the solder layer. The phase change temperature for indium will require that the heat sink temperature be raised up to at least about 400° Fahrenheit. In the case of gold-tin solder, the temperature should go up to about 700° Fahrenheit (about 320° C.).

This reflow technique in combination with the oxygen stripping gas results in much higher efficiency solder joints between the bonded gallium arsenide laser diode chip and the underlying heat sink. This effeciency is reflected in higher power output possibilities for the laser diode chips and increased functional lifetimes for the chips.

We claim:

1. A flux-free process for soldering an element to a heat sink comprising:
   depositing flux-free oxidizable solder onto a surface of a heat sink and allowing limited oxidation of the solder surface; then
   placing the element into proper position on the solder covered surface; then
   placing the heat sink and element into a pressure controlled low vacuum chamber environment and therein raising the temperature of the solder to a level below its melting point for a first interval of time; and
   during the first period, conducting a plurality of oxygen stripping gas introduction/purge cycles within the chamber; then
   raising the temperature of the solder to an elevated level sufficient to cause a solid-to-liquid phase change to the solder layer, which is marked by optically detecting the change in phase from solid to liquid of the solder layer by monitoring for the reflectivity change characteristic of the phase transition, in the presence of the oxygen stripping gas within the chamber;

holding the solder in a liquid state for a second interval of time sufficient to allow the majority of the solder oxidation at the interface between the solder and the element to be removed by the action of the oxygen stripping gas; then rapidly cooling the heat sink and element to a temperature at which the solder is solid.

2. The process of claim 1 wherein the solder comprises indium.

3. The process of claim 1 wherein the second interval of time during which the solder is liquid is less than about 90 seconds.

4. The process of claim 2 wherein the temperature of the solder during the first interval falls within the range of from about 130° C. to about 160° C.

5. The process of claim 2 wherein the pressure within the chamber is no less than $1 \times 10^{-3}$ Torr.

6. The process of claim 2 wherein the temperature during the second time period is greater than about 160° C.

7. The process of claim 1 wherein the solder is an alloy selected from the group of gold/tin and other eutectic alloys having melting points less than 300° C.

8. The process of claim 1 wherein the oxygen stripping gas consists essentially of hydrogen.

9. The process of claim 1 wherein the oxygen stripping gas consists essentially of a mixture of hydrogen and nitrogen.

10. The process of claim 2 wherein the element comprises a gallium arsenide laser diode chip.

* * * * *